(12) United States Patent
Ulrich

(10) Patent No.: US 9,917,711 B2
(45) Date of Patent: *Mar. 13, 2018

(54) MULTILEVEL DRIVER FOR HIGH SPEED CHIP-TO-CHIP COMMUNICATIONS

(71) Applicant: KANDOU LABS, S.A., Lausanne (CH)

(72) Inventor: Roger Ulrich, Bern (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 15/402,148

(22) Filed: Jan. 9, 2017

(65) Prior Publication Data
US 2017/0118048 A1   Apr. 27, 2017

Related U.S. Application Data

(63) Continuation of application No. 14/829,388, filed on Aug. 18, 2015, now Pat. No. 9,544,015, which is a continuation of application No. 14/315,306, filed on Jun. 25, 2014, now Pat. No. 9,112,550.

(51) Int. Cl.
| | |
|---|---|
| *H04L 25/03* | (2006.01) |
| *H04B 3/04* | (2006.01) |
| *H04L 25/49* | (2006.01) |

(52) U.S. Cl.
CPC ......... *H04L 25/03878* (2013.01); *H04B 3/04* (2013.01); *H04L 25/4917* (2013.01)

(58) Field of Classification Search
CPC . H04L 2025/03363; H04L 2025/03471; H04L 2025/03878; H04L 1/0041; H04L 25/4917; H04B 3/04
See application file for complete search history.

(56) References Cited

U.S. PATENT DOCUMENTS

| | | |
|---|---|---|
| 668,687 A | 2/1901 | Mayer |
| 780,883 A | 1/1905 | Hinchman |
| 3,196,351 A | 7/1965 | Slepian |
| 3,636,463 A | 1/1972 | Ongkiehong |
| 3,939,468 A | 2/1976 | Mastin |
| 4,163,258 A | 7/1979 | Ebihara |
| 4,181,967 A | 1/1980 | Nash |
| 4,206,316 A | 6/1980 | Burnsweig |
| 4,276,543 A | 6/1981 | Miller |
| 4,486,739 A | 12/1984 | Franaszek |
| 4,499,550 A | 2/1985 | Ray, III |

(Continued)

FOREIGN PATENT DOCUMENTS

| | | |
|---|---|---|
| CN | 101478286 | 7/2009 |
| EP | 2039221 | 2/2013 |

(Continued)

OTHER PUBLICATIONS

Notification of Transmittal of the International Search Report and The Written Opinion of the International Searching Authority, or the Declaration, dated Feb. 15, 2017, 10 pages.

(Continued)

*Primary Examiner* — Leon Flores
(74) *Attorney, Agent, or Firm* — Invention Mine, LLC

(57) ABSTRACT

Transmission line driver systems are described which are comprised of multiple paralleled driver elements. The paralleled structure allows efficient generation of multiple output signal levels with adjustable output amplitude, optionally including Finite Impulse Response signal shaping and skew pre-compensation.

20 Claims, 7 Drawing Sheets

(56) References Cited

U.S. PATENT DOCUMENTS

| | | |
|---|---|---|
| 4,722,084 A | 1/1988 | Morton |
| 4,772,845 A | 9/1988 | Scott |
| 4,774,498 A | 9/1988 | Traa |
| 4,864,303 A | 9/1989 | Ofek |
| 4,897,657 A | 1/1990 | Brubaker |
| 4,974,211 A | 11/1990 | Corl |
| 5,017,924 A | 5/1991 | Guiberteau |
| 5,053,974 A | 10/1991 | Penz |
| 5,166,956 A | 11/1992 | Baltus |
| 5,168,509 A | 12/1992 | Nakamura |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan |
| 5,449,895 A | 9/1995 | Hecht |
| 5,459,465 A | 10/1995 | Kagey |
| 5,461,379 A | 10/1995 | Weinman |
| 5,511,119 A | 4/1996 | Lechleider |
| 5,553,097 A | 9/1996 | Dagher |
| 5,566,193 A | 10/1996 | Cloonan |
| 5,599,550 A | 2/1997 | Kohlruss |
| 5,626,651 A | 5/1997 | Dullien |
| 5,629,651 A | 5/1997 | Mizuno |
| 5,659,353 A | 8/1997 | Kostreski |
| 5,727,006 A | 3/1998 | Dreyer |
| 5,748,948 A | 5/1998 | Yu |
| 5,802,356 A | 9/1998 | Gaskins |
| 5,825,808 A | 10/1998 | Hershey |
| 5,856,935 A | 1/1999 | Moy |
| 5,875,202 A | 2/1999 | Venters |
| 5,945,935 A | 8/1999 | Kusumoto |
| 5,949,060 A | 9/1999 | Schattschneider |
| 5,982,954 A | 11/1999 | Delen |
| 5,995,016 A | 11/1999 | Perino |
| 5,999,016 A | 12/1999 | McClintock |
| 6,005,895 A | 12/1999 | Perino |
| 6,084,883 A | 7/2000 | Norrell |
| 6,119,263 A | 9/2000 | Mowbray |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,316,987 B1 | 11/2001 | Dally |
| 6,346,907 B1 | 2/2002 | Dacy |
| 6,359,931 B1 | 3/2002 | Perino |
| 6,378,073 B1 | 4/2002 | Davis |
| 6,398,359 B1 | 6/2002 | Silverbrook |
| 6,404,820 B1 | 6/2002 | Postol |
| 6,417,737 B1 | 7/2002 | Moloudi |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino |
| 6,509,773 B2 | 1/2003 | Buchwald |
| 6,522,699 B1 | 2/2003 | Anderson |
| 6,556,628 B1 | 4/2003 | Poulton |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius |
| 6,664,355 B2 | 12/2003 | Kim |
| 6,686,879 B2 | 2/2004 | Shattil |
| 6,766,342 B2 | 7/2004 | Kechriotis |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,876,317 B2 | 4/2005 | Sankaran |
| 6,898,724 B2 | 5/2005 | Chang |
| 6,927,709 B2 | 8/2005 | Kiehl |
| 6,954,492 B1 | 10/2005 | Williams |
| 6,963,622 B2 | 11/2005 | Eroz |
| 6,972,701 B2 | 12/2005 | Jansson |
| 6,973,613 B2 | 12/2005 | Cypher |
| 6,976,194 B2 | 12/2005 | Cypher |
| 6,982,954 B2 | 1/2006 | Dhong |
| 6,990,138 B2 | 1/2006 | Bejjani |
| 6,991,038 B2 | 1/2006 | Guesnon |
| 6,993,311 B2 | 1/2006 | Li |
| 6,999,516 B1 | 2/2006 | Rajan |
| 7,023,817 B2 | 4/2006 | Kuffner |
| 7,039,136 B2 | 5/2006 | Olson |
| 7,053,802 B2 | 5/2006 | Cornelius |
| 7,075,996 B2 | 7/2006 | Simon |
| 7,080,288 B2 | 7/2006 | Ferraiolo |
| 7,082,557 B2 | 7/2006 | Schauer |
| 7,085,153 B2 | 8/2006 | Ferrant |
| 7,085,336 B2 | 8/2006 | Lee |
| 7,127,003 B2 | 10/2006 | Rajan |
| 7,130,944 B2 | 10/2006 | Perino |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,180,949 B2 | 2/2007 | Kleveland |
| 7,184,483 B2 | 2/2007 | Rajan |
| 7,199,728 B2 | 4/2007 | Dally |
| 7,231,558 B2 | 6/2007 | Gentieu |
| 7,269,130 B2 | 9/2007 | Pitio |
| 7,269,212 B1 | 9/2007 | Chau |
| 7,335,976 B2 | 2/2008 | Chen |
| 7,336,112 B1 | 2/2008 | Sha |
| 7,339,990 B2 | 3/2008 | Hidaka |
| 7,346,819 B2 | 3/2008 | Bansal |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,362,697 B2 | 4/2008 | Becker |
| 7,366,942 B2 | 4/2008 | Lee |
| 7,370,264 B2 | 5/2008 | Worley |
| 7,372,390 B2 | 5/2008 | Yamada |
| 7,389,333 B2 | 6/2008 | Moore |
| 7,397,302 B2 | 7/2008 | Bardsley |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,570,704 B2 | 4/2009 | Nagarajan |
| 7,535,957 B2 | 5/2009 | Ozawa |
| 7,539,532 B2 | 5/2009 | Tran |
| 7,599,390 B2 | 10/2009 | Pamarti |
| 7,616,075 B2 | 11/2009 | Kushiyama |
| 7,620,116 B2 | 11/2009 | Bessios |
| 7,633,850 B2 | 12/2009 | Nagarajan |
| 7,639,596 B2 | 12/2009 | Cioffi |
| 7,643,588 B2 | 1/2010 | Visalli |
| 7,650,525 B1 | 1/2010 | Chang |
| 7,656,321 B2 | 2/2010 | Wang |
| 7,694,204 B2 | 4/2010 | Schmidt |
| 7,697,915 B2 | 4/2010 | Behzad |
| 7,698,088 B2 | 4/2010 | Sul |
| 7,706,456 B2 | 4/2010 | Laroia |
| 7,706,524 B2 | 4/2010 | Zerbe |
| 7,746,764 B2 | 6/2010 | Rawlins |
| 7,768,312 B2 | 8/2010 | Hirose |
| 7,787,572 B2 | 8/2010 | Scharf |
| 7,804,361 B2 | 9/2010 | Lim |
| 7,808,456 B2 | 10/2010 | Chen |
| 7,808,883 B2 | 10/2010 | Green |
| 7,841,909 B2 | 11/2010 | Murray |
| 7,869,497 B2 | 1/2011 | Benvenuto |
| 7,869,546 B2 | 1/2011 | Tsai |
| 7,882,413 B2 | 2/2011 | Chen |
| 7,899,653 B2 | 3/2011 | Hollis |
| 7,907,676 B2 | 3/2011 | Stojanovic |
| 7,933,770 B2 | 4/2011 | Kruger |

(56) References Cited

U.S. PATENT DOCUMENTS

| | | |
|---|---|---|
| 8,000,664 B2 | 8/2011 | Khorram |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,375 B2 | 4/2012 | Abbasfar |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,233,544 B2 | 7/2012 | Bao |
| 8,245,094 B2 | 8/2012 | Jiang |
| 8,253,454 B2 | 8/2012 | Lin |
| 8,279,094 B2 | 10/2012 | Abbasfar |
| 8,289,914 B2 | 10/2012 | Li |
| 8,295,250 B2 | 10/2012 | Gorokhov |
| 8,295,336 B2 | 10/2012 | Lutz |
| 8,310,389 B1 | 11/2012 | Chui |
| 8,341,492 B2 | 12/2012 | Shen |
| 8,359,445 B2 | 1/2013 | Ware |
| 8,365,035 B2 | 1/2013 | Hara |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,891 B2 | 6/2013 | Kizer |
| 8,472,513 B2 | 6/2013 | Malipatil |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,602,643 B2 | 12/2013 | Gardiner |
| 8,604,879 B2 | 12/2013 | Mourant |
| 8,620,166 B2 | 12/2013 | Guha |
| 8,638,241 B2 | 1/2014 | Sudhakaran |
| 8,643,437 B2 | 2/2014 | Chiu |
| 8,649,445 B2 | 2/2014 | Cronie |
| 8,649,460 B2 | 2/2014 | Ware |
| 8,649,556 B2 | 2/2014 | Wedge |
| 8,649,840 B2 | 2/2014 | Sheppard, Jr. |
| 8,674,861 B2 | 3/2014 | Matsuno |
| 8,687,968 B2 | 4/2014 | Nosaka |
| 8,711,919 B2 | 4/2014 | Kumar |
| 8,718,184 B1 | 5/2014 | Cronie |
| 8,755,426 B1 | 6/2014 | Cronie |
| 8,773,964 B2 | 7/2014 | Hsueh |
| 8,780,687 B2 | 7/2014 | Clausen |
| 8,782,578 B2 | 7/2014 | Tell |
| 8,831,440 B2 | 9/2014 | Yu |
| 8,879,660 B1 | 11/2014 | Peng |
| 8,897,134 B2 | 11/2014 | Kern |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,975,948 B2 | 3/2015 | GonzalezDiaz |
| 8,989,317 B1 | 3/2015 | Holden |
| 9,015,566 B2 | 4/2015 | Cronie |
| 9,020,049 B2 | 4/2015 | Schwager |
| 9,036,764 B1 | 5/2015 | Hossain |
| 9,059,816 B1 | 6/2015 | Simpson |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,106,465 B2 | 8/2015 | Walter |
| 9,124,557 B2 | 9/2015 | Fox |
| 9,148,087 B1 | 9/2015 | Tajalli |
| 9,152,495 B2 | 10/2015 | Losh |
| 9,165,615 B2 | 10/2015 | Amirkhany |
| 9,172,412 B2 | 10/2015 | Kim |
| 9,178,503 B2 | 11/2015 | Hsieh |
| 9,183,085 B1 | 11/2015 | Northcott |
| 9,197,470 B2 | 11/2015 | Okunev |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,300,503 B1 | 3/2016 | Holden |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |
| 9,461,862 B2 | 10/2016 | Holden |
| 9,509,437 B2 | 11/2016 | Shokrollahi |
| 9,544,015 B2 | 1/2017 | Ulrich |
| 2002/0044316 A1 | 4/2002 | Myers |
| 2002/0057592 A1 | 5/2002 | Robb |
| 2002/0154633 A1 | 10/2002 | Shin |
| 2002/0174373 A1 | 11/2002 | Chang |
| 2002/0181607 A1 | 12/2002 | Izumi |
| 2003/0016770 A1 | 1/2003 | Trans |
| 2003/0146783 A1 | 8/2003 | Bandy |
| 2004/0027185 A1 | 2/2004 | Fiedler |
| 2004/0146117 A1 | 7/2004 | Subramaniam |
| 2004/0155802 A1 | 8/2004 | Lamy |
| 2004/0161019 A1 | 8/2004 | Raghavan |
| 2004/0169529 A1 | 9/2004 | Afghahi |
| 2005/0134380 A1 | 6/2005 | Nairn |
| 2005/0174841 A1 | 8/2005 | Ho |
| 2005/0213686 A1 | 9/2005 | Love |
| 2006/0097786 A1 | 5/2006 | Su |
| 2006/0103463 A1 | 5/2006 | Lee |
| 2006/0126751 A1 | 6/2006 | Bessios |
| 2006/0159005 A1 | 7/2006 | Rawlins |
| 2007/0002954 A1 | 1/2007 | Cornelius |
| 2007/0030796 A1 | 2/2007 | Green |
| 2007/0204205 A1 | 8/2007 | Niu |
| 2007/0263711 A1 | 11/2007 | Kramer |
| 2007/0283210 A1 | 12/2007 | Prasad |
| 2008/0007367 A1 | 1/2008 | Kim |
| 2008/0012598 A1 | 1/2008 | Mayer |
| 2008/0104374 A1 | 5/2008 | Mohamed |
| 2008/0159448 A1 | 7/2008 | Anim-Appiah |
| 2008/0192621 A1 | 8/2008 | Suehiro |
| 2008/0317188 A1 | 12/2008 | Staszewski |
| 2009/0059782 A1 | 3/2009 | Cole |
| 2009/0195281 A1 | 8/2009 | Tamura |
| 2009/0316730 A1 | 12/2009 | Feng |
| 2009/0323864 A1 | 12/2009 | Tired |
| 2010/0046644 A1 | 2/2010 | Mazet |
| 2010/0081451 A1 | 4/2010 | Mueck |
| 2010/0180143 A1 | 7/2010 | Ware |
| 2010/0215112 A1 | 8/2010 | Tsai |
| 2010/0235673 A1 | 9/2010 | Abbasfar |
| 2010/0296556 A1 | 11/2010 | Rave |
| 2010/0309964 A1 | 12/2010 | Oh |

(56) References Cited

U.S. PATENT DOCUMENTS

| | | |
|---|---|---|
| 2011/0051854 A1 | 3/2011 | Kizer |
| 2011/0072330 A1 | 3/2011 | Kolze |
| 2011/0084737 A1 | 4/2011 | Oh |
| 2011/0127990 A1 | 6/2011 | Wilson |
| 2011/0235501 A1 | 9/2011 | Goulahsen |
| 2011/0268225 A1 | 11/2011 | Cronie |
| 2011/0299555 A1 | 12/2011 | Cronie |
| 2011/0302478 A1 | 12/2011 | Cronie |
| 2011/0317559 A1 | 12/2011 | Kern |
| 2012/0152901 A1 | 6/2012 | Nagorny |
| 2012/0161945 A1 | 6/2012 | Single |
| 2012/0213299 A1 | 8/2012 | Cronie |
| 2013/0010892 A1 | 1/2013 | Cronie |
| 2013/0013870 A1 | 1/2013 | Cronie |
| 2013/0114519 A1 | 5/2013 | Gaal |
| 2013/0147553 A1 | 6/2013 | Iwamoto |
| 2013/0188656 A1 | 7/2013 | Ferraiolo |
| 2013/0195155 A1 | 8/2013 | Pan |
| 2013/0259113 A1 | 10/2013 | Kumar |
| 2013/0315501 A1 | 11/2013 | Atanassov |
| 2013/0346830 A1 | 12/2013 | Ordentlich |
| 2014/0177645 A1 | 6/2014 | Cronie |
| 2015/0078479 A1 | 3/2015 | Whitby-Strevens |
| 2015/0146771 A1 | 5/2015 | Walter |
| 2015/0222458 A1 | 8/2015 | Hormati |
| 2015/0249559 A1 | 9/2015 | Shokrollahi |
| 2015/0333940 A1 | 11/2015 | Shokrollahi |
| 2015/0349835 A1 | 12/2015 | Fox |
| 2015/0380087 A1 | 12/2015 | Mittelholzer |
| 2015/0381232 A1 | 12/2015 | Ulrich |
| 2016/0020706 A1 | 1/2016 | Hormati |
| 2016/0020824 A1 | 1/2016 | Ulrich |
| 2016/0036616 A1 | 2/2016 | Holden |

FOREIGN PATENT DOCUMENTS

| | | |
|---|---|---|
| JP | 2003163612 | 6/2003 |
| WO | 2009084121 | 7/2009 |
| WO | 2010031824 | 3/2010 |
| WO | 2011119359 | 9/2011 |

OTHER PUBLICATIONS

Notification of Transmittal of the International Search Report and the Written Opinion of the International Searching Authority, or the Declaration, for PCT/US17/14997, dated Apr. 7, 2017.

Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.

Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.

Holden, B., "Using Ensemble NRZ Coding for 400GE Electrical Interfaces", IEEE 802.3 400GE Study Group, May 17, 2013, 24 pages, http://www.ieee802.org/3/400GSG/public/13_05/holden_400_01_0513.pdf.

"Introduction to: Analog Computers and the DSPACE System," Course Material ECE 5230 Spring 2008, Utah State University, www.coursehero.com, 12 pages.

Abbasfar, A., "Generalized Differential Vector Signaling", IEEE International Conference on Communications, ICC 09, (Jun. 14, 2009), pp. 1-5.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Burr, "Spherical Codes for M-ARY Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Counts, L., et al., "One-Chip Slide Rule Works with Logs, Antilogs for Real-Time Processing," Analog Devices Computational Products 6, Reprinted from Electronic Design, May 2, 1985, 7 pages.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

"Design Brief 208 Using the Anadigm Multiplier CAM", Copyright 2002 Anadigm, 6 pages.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.

Grahame, J., "Vintage Analog Computer Kits," posted on Aug. 25, 2006 in Classic Computing, 2 pages, http.//www.retrothing.com/2006/08/classic_analog_.html.

Healey, A., et al., "A Comparison of 25 Gbps NRZ & PAM-4 Modulation used in Legacy & Premium Backplane Channels", DesignCon 2012, 16 pages.

International Search Report and Written Opinion for PCT/EP2011/059279 dated Sep. 22, 2011.

International Search Report and Written Opinion for PCT/EP2011/074219 dated Jul. 4, 2012.

International Search Report and Written Opinion for PCT/EP2012/052767 dated May 11, 2012.

International Search Report and Written Opinion for PCT/US14/052986 dated Nov. 24, 2014.

International Search Report and Written Opinion from PCT/US2014/034220 dated Aug. 21, 2014.

International Search Report and Written Opinion of the International Searching Authority, dated Jul. 14, 2011 in International Patent Application S.N. PCT/EP2011/002170, 10 pages.

International Search Report and Written Opinion of the International Searching Authority, dated Nov. 5, 2012, in International Patent Application S.N. PCT/EP2012/052767, 7 pages.

International Search Report for PCT/US2014/053563, dated Nov. 11, 2014, 2 pages.

Jiang, A., et al., "Rank Modulation for Flash Memories", IEEE Transactions of Information Theory, Jun. 2006, vol. 55, No. 6, pp. 2659-2673.

Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.

Notification of Transmittal of International Search Report and the Written Opinion of the International Searching Authority, for PCT/US2015/018363, dated Jun. 18, 2015, 13 pages.

Notification of Transmittal of The International Search Report and The Written Opinion of the International Searching Authority, or The Declaration for PCT/EP2013/002681, dated Feb. 25, 2014, 15 pages.

Notification of Transmittal of The International Search Report and The Written Opinion of The International Searching Authority, or The Declaration, dated Mar. 3, 2015, for PCT/US2014/066893, 9 pages.

Notification of Transmittal of The International Search Report and The Written Opinion of the International Searching Authority, or the Declaration, for PCT/US2014/015840, dated May 20, 2014. 11 pages.

Notification of Transmittal of The International Search Report and The Written Opinion of the International Searching Authority, or the Declaration, for PCT/US2014/043965, dated Oct. 22, 2014, 10 pages.

Notification of Transmittal of the International Search Report and the Written Opinion of the International Searching Authority, or the Declaration, for PCT/US2015/037466, dated Nov. 19, 2015.

(56) References Cited

OTHER PUBLICATIONS

Notification of Transmittal of the International Search Report and The Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Oh, et al., Pseudo-Differential Vector Signaling for Noise Reduction in Single-Ended Signaling, DesignCon 2009.
Poulton, et al., "Multiwire Differential Signaling", UNC-CH Department of Computer Science Version 1.1, Aug. 6, 2003.
Schneider, J., et al., "ELEC301 Project: Building an Analog Computer," Dec. 19, 1999, 8 pages, http://www.clear.rice.edu/elec301/Projects99/anlgcomp/.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Skliar et al., A Method for the Analysis of Signals: the Square-Wave Method, Mar. 2008, Revista de Matematica: Teoria y Aplicationes, pp. 109-129.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallini, L., et al., "Transmission Time Analysis for the Parallel Asynchronous Communication Scheme", IEEE Transactions on Computers, vol. 52, No. 5, May 2003, pp. 558-571.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Zouhair Ben-Neticha et al, "The 'streTched—Golay and other codes for high-SNR fnite-delay quantization of the Gaussian source at 1/2 Bit per sample", IEEE Transactions on Communications, vol. 38, No. 12 Dec. 1, 1990, pp. 2089-2093, XP000203339, ISSN: 0090-6678, DOI: 10.1109/26.64647.

MULTILEVEL DRIVER FOR HIGH SPEED CHIP-TO-CHIP COMMUNICATIONS

REFERENCES

This application is a continuation of U.S. application Ser. No. 14/829,388, filed Aug. 18, 2015, naming Roger Ulrich, entitled "Multilevel Driver Circuit for High Speed Chip-to-Chip Communications," which is a continuation of U.S. application Ser. No. 14/315,306, filed Jun. 25, 2014, naming Roger Ulrich, entitled "Multilevel Driver Circuit for High Speed Chip-to-Chip Communications," all of which are hereby incorporated by reference in their entirety for all purposes.

The following references are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication No. 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III");

U.S. Provisional Patent Application No. 61/753,870, filed Jan. 17, 2013, naming John Fox, Brian Holden, Peter Hunt, John D Keay, Amin Shokrollahi, Richard Simpson, Anant Singh, Andrew Kevin John Stewart, and Giuseppe Surace, entitled "Methods and Systems for Chip-to-chip Communication with Reduced Simultaneous Switching Noise" (hereinafter called "Fox I");

U.S. Provisional Patent Application No. 61/763,403, filed Feb. 11, 2013, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Chip-to-Chip Communications Interface" (hereinafter called "Fox II");

U.S. Provisional Patent Application No. 61/773,709, filed Mar. 6, 2013, naming John Fox, Brian Holden, Peter Hunt, John D Keay, Amin Shokrollahi, Andrew Kevin John Stewart, Giuseppe Surace, and Roger Ulrich, entitled "Methods and Systems for High Bandwidth Chip-to-Chip Communications Interface" (hereinafter called "Fox III");

U.S. Provisional Patent Application No. 61/812,667, filed Apr. 16, 2013, naming John Fox, Brian Holden, Ali Hormati, Peter Hunt, John D Keay, Amin Shokrollahi, Anant Singh, Andrew Kevin John Stewart, and Giuseppe Surace, entitled "Methods and Systems for High Bandwidth Communications Interface" (hereinafter called "Fox IV");

U.S. patent application Ser. No. 13/842,740, filed Mar. 15, 2013, naming Brian Holden, Amin Shokrollahi, and Anant Singh, entitled "Methods and Systems for Skew Tolerance in and Advanced Detectors for Vector Signaling Codes for Chip-to-Chip Communication" (hereinafter called "Holden I");

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences" (hereinafter called "Ulrich I").

The following references are cited in this application using the labels set out in brackets:

[Kojima] U.S. Pat. No. 8,575,961, filed Oct. 13, 2009 and issued Nov. 5, 2013, naming Shoji Kojima, and entitled "Multi-Valued Driver Circuit".

BACKGROUND

In communication systems, information may be transmitted from one physical location to another. Furthermore, it is typically desirable that the transport of this information is reliable, is fast and consumes a minimal amount of resources. One of the most common information transfer media is the serial communications link, which may be based on a single wire circuit relative to ground or other common reference, multiple such circuits relative to ground or other common reference, or multiple circuits used in relation to each other.

In the general case, a serial communications link is used over multiple time periods. In each such time period, a signal or signals over the link represents, and thus conveys, some amount of information typically measured in bits. Thus, at a high level, a serial communications link connects a transmitter to a receiver and the transmitter transmits a signal or signals each time period, the receiver receives signal or signals approximating those transmitted (as the result of signal degradation over the link, noise, and other distortions.) The information being conveyed by the transmitter is "consumed" by the transmitter, and representative signals are generated. The receiver attempts to determine the conveyed information from the signals it receives. In the absence of overall errors, the receiver can output exactly the bits that were consumed by the transmitter.

The optimum design of a serial communications link often depends on the application for which it is used. In many cases, there are trade-offs between various performance metrics, such as bandwidth (number of bits that can be conveyed per unit time and/or per period), pin efficiency (number of bits or bit equivalents that can be conveyed at one time divided by the number of wires required for that conveyance), power consumption (units of energy consumed by the transmitter, signal logic, receiver, etc. per bit conveyed), SSO resilience and cross-talk resilience, and expected error rate.

An example of a serial communications link is a differential signaling (DS) link. Differential signaling operates by sending a signal on one wire and the opposite of that signal on a paired wire; the signal information is represented by the difference between the wires rather than their absolute values relative to ground or other fixed reference. Differential signaling enhances the recoverability of the original signal at the receiver over single ended signaling (SES), by cancelling crosstalk and other common-mode noise. There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors. In the example of eight SES wires, where each component has a degree of freedom allowing it to be either of the two possible coordinates, the number of code words in the collection of code words is $2^8$, or 256. As with SES or DS links, output drivers used with a binary vector signaling code need only emit two distinct voltage- or current-levels, corresponding to the two possible coordinate values for each vector element.

With non-binary vector signaling, each component has a coordinate value that is a selection from a set of more than two possible values. A "non-binary vector signaling code" refers to a mapping and/or set of rules to map information bits to non-binary vectors. The corresponding output driver for a non-binary vector signaling code must be capable of emitting multiple voltage- or current-levels corresponding to the selected coordinate values for each vector output.

Examples of vector signaling methods are described in Cronie I, Cronie II, Cronie III, Fox I, Fox II, Fox III, Fox IV, and Holden I.

BRIEF DESCRIPTION

A transmitter and receiver can communicate using a serial communications link, wherein the serial communications link uses signaling based on a balanced vector signaling code. The vector signaling code transmits a vector of symbols using multiple wires of the communications link in each transmit unit interval. The number of components of the vector can be two, three, four, or more than four. The number of coordinate values for a component can be two, three, four, or more than four. For example, a link might use four components with four possible coordinate values: a high value, a low value, and inverses of the high and low values, such that a signal having the high value cancels out three signals having the inverse of the low value and a signal having the inverse of the high value cancels out three signals having the low value and, in this manner, the link can convey three bits in a signal period using those four components by mapping the eight possible three bit combinations onto the eight vector code words represented by the four permutations of one high value and three inverses of the low value plus the four permutations of the inverse of one high value and three low values. In a more specific embodiment, the high and low values are voltage values and relative to a reference, the high value and its inverse have the same magnitude but opposite signs, the low value and its inverse have the same magnitude but opposite signs, and the high value has a magnitude three times the low value. As another example, a different link might use three components chosen from three possible coordinate values: a positive value, a smaller positive value, and a smallest positive value or zero, such that the sum of all vector component values is a constant. Such a code is also balanced, albeit with an additional offset or DC component superimposed upon all possible coordinate values as is common practice in embodiments relying on single-ended power supplies.

In accordance with at least one embodiment of the invention, processes and apparatuses provide for transmitting data over physical channels to provide a high speed, low latency interface providing high total bandwidth at low power utilization, such as to interconnect integrated circuit chips in a multi-chip system. In some embodiments, different voltage, current, etc. levels are used for signaling and more than two levels may be used, such as a quaternary signaling system wherein each wire signal has one of four values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

DETAILED DESCRIPTION

Figure 1:
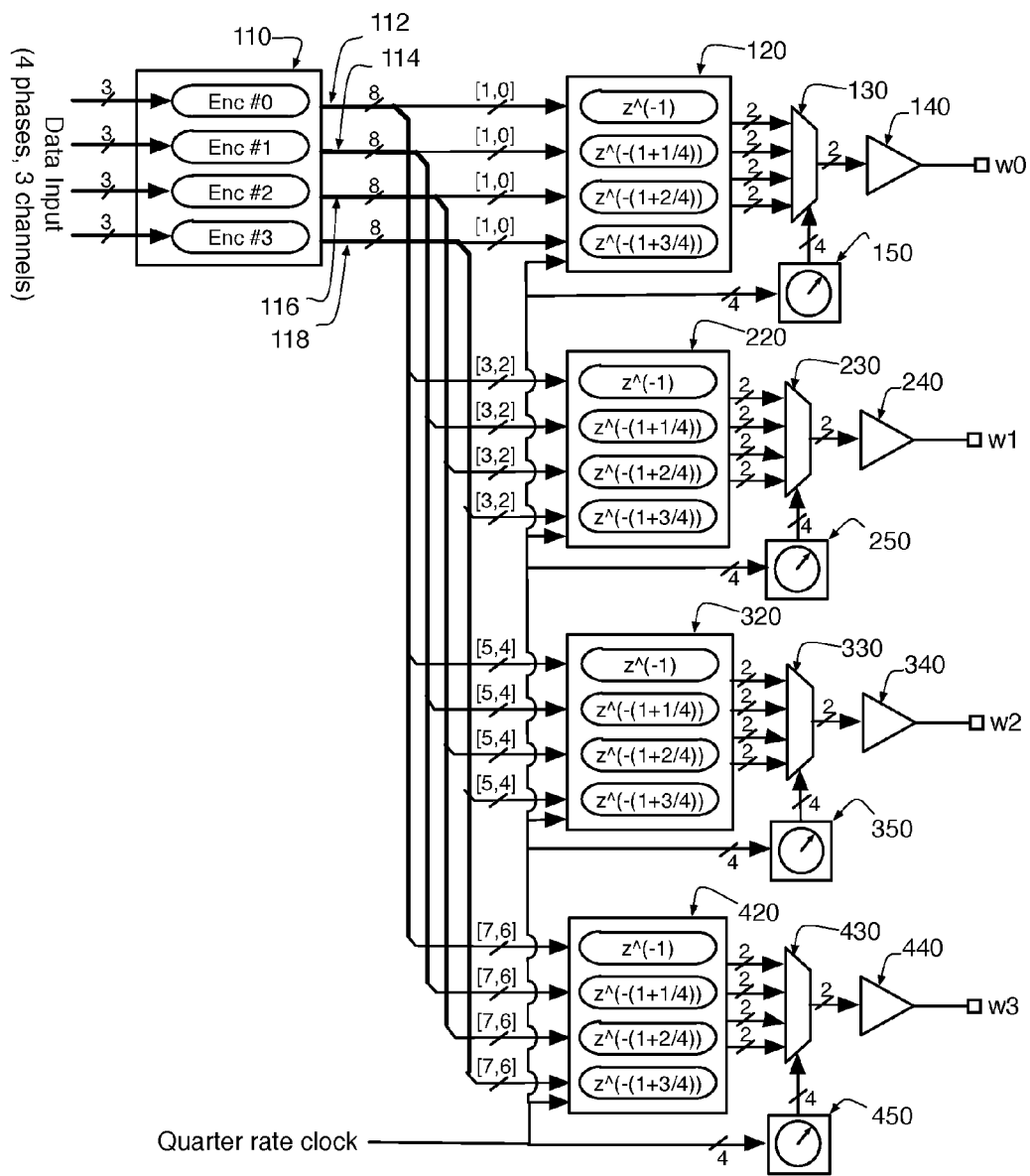
FIG. 1 is a block diagram of one embodiment of a four wire driver incorporating four processing phases.

Despite the increasing technological ability to integrate entire systems into a single integrated circuit, multiple chip systems and subsystems retain significant advantages. For purposes of description and without limitation, example embodiments of at least some aspects of the invention herein described assume a systems environment of (1) at least one point-to-point communications interface connecting two integrated circuit chips representing a transmitter and a receiver, (2) wherein the communications interface is supported by at least one interconnection group of four high-speed transmission line signal wires providing medium loss connectivity at high speed, (3) a vector signaling code carries information from the transmitter to the receiver as simultaneously transmitted values on each wire of a group with individual values being selected from four levels and, (4) the overall group is constrained by the vector signaling code to a fixed sum of levels.

Thus in one embodiment, symbol coordinate values of the H4 vector signaling code first described in [Cronie I] are transmitted as offset voltage levels from a fixed reference, as one example a +200 mV offset representing a "+1", a −66 mV offset representing a "−⅓", etc. At least one embodiment provides adjustment of transmission offset amplitudes so that the minimum levels appropriate to the desired receive signal/noise ratio may be used, minimizing transmission power.

Physical Channel Characteristics

For purposes of description and without limitation, a communications channel comprised of at least one group of, as a first example, four microstripline wires separated by a dielectric layer from a ground plane is assumed. The four wires of the group are routed together with homogenous fabrication characteristics, to minimize variations in attenuation and propagation velocity. It is further assumed that each wire in this channel is terminated at each end in its characteristic transmission line impedance. Thus, following conventional good practice for a typical transmission line impedance of 50 ohms, signals are issued by a transmitter having a source impedance of 50 ohms, and are detected at the receiver as voltages across or current through a 50 ohm termination resistance. As a second example, the group size is increased to six wires with all other characteristics as previously described. Increasing the group size enables the use of codes capable of communicating more information per wire (known as "pin efficiency",) at the cost of more complex routing and fabrication constraints to insure all wires of the group maintain the same transmission line characteristics.

Example signal levels, signal frequencies, and physical dimensions described herein are provided for purposes of explanation, and are not limiting. Different vector signaling codes may be used, communicated using more or fewer wires per group, fewer or greater numbers of signal levels per wire, and/or with different code word constraints. For convenience, signal levels are described herein as voltages, rather than their equivalent current values.

Other embodiments of the invention may utilize different signaling levels, connection topology, termination methods, and/or other physical interfaces, including optical, inductive, capacitive, or electrical interconnection. Similarly, examples based on unidirectional communication from transmitter to receiver are presented for clarity of description; combined transmitter-receiver embodiments and bidirectional communication embodiments are also explicitly in accordance with the invention.

H4 Code

Figure 7A:
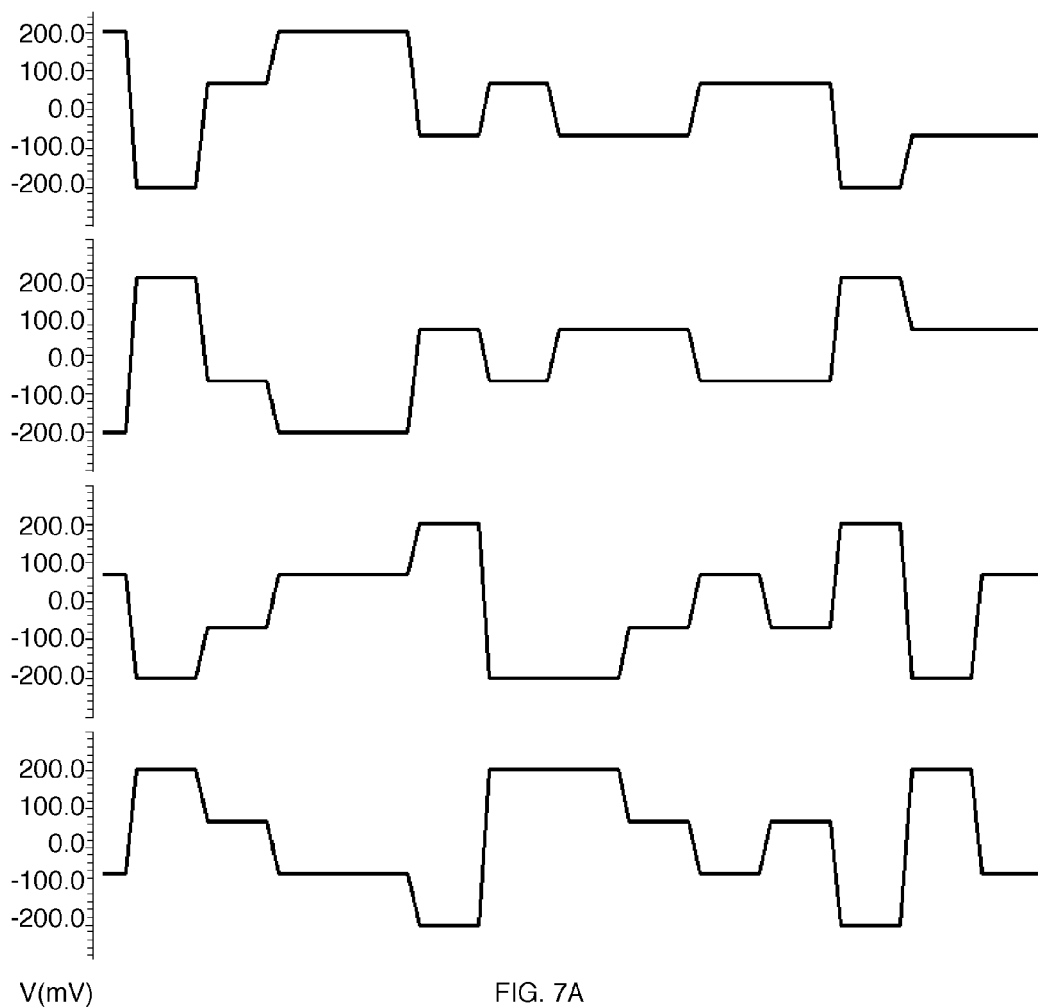
FIGS. 7A and 7B show individual wire signals of a transmitted H4 code and the combined signaling of all wires depicting the use of two of the four signal levels per transmit interval, in accordance with at least one embodiment of the invention.
Figure 7B:
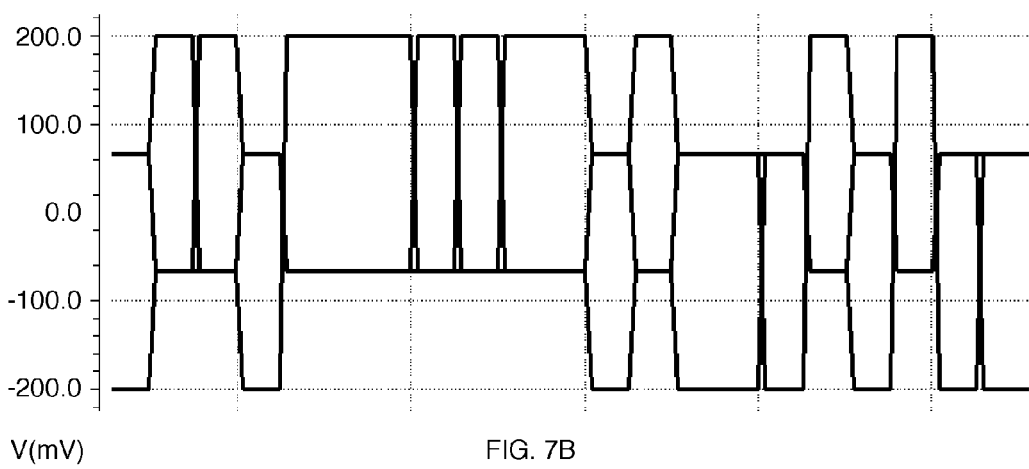

As used herein, "H4" code, also called Ensemble NRZ code, refers to a vector signaling code and associated logic for such code wherein a transmitter consumes three bits and outputs a series of signals on four wires in each symbol period. In some embodiments, parallel configurations comprising more than one group may be used, with each group comprising three bits transmitted on four wires per symbol period and an H4 encoder and an H4 decoder per group. With an H4 code, there are four signal wires and four possible coordinate values, represented herein as +1, +⅓, −⅓, and −1. The H4 code words are balanced, in that each code word is either one of the four permutations of (+1, −⅓, −⅓, −⅓) or one of the four permutations of (−1, +⅓, +⅓, +⅓), all such permutations summing to the equivalent of a zero value. H4 encoded signal waveforms for four wire outputs are shown in FIG. 7A. It should be noted that although the constellation of all code words utilizes four distinct signal levels, only two signal levels will be utilized in any one code word, as is illustrated by a superposition of all four signal waveforms, as shown in FIG. 7B.

In a specific embodiment, a +1 might be sent as a signal using an offset of 200 mV, while a −1 is sent as a signal using an offset of −200 mV, a +⅓ is sent as a signal using an offset of 66 mV, and a −⅓ is sent as a signal using an offset of −66 mV, wherein the voltage levels are with respect to a fixed reference. Note that the average of all of the signals sent (or received, disregarding asymmetric effects of skew, crosstalk, and attenuation) in any single time interval regardless of the code word represented is "0", corresponding to the fixed reference voltage. There are eight distinct code words in H4, which is sufficient to encode three binary bits per transmitted symbol interval.

Other variants of the H4 coding described above exist as well. The signal levels are given as examples, without limitation, and represent incremental signal values from a nominal reference level.

5b6w Ternary Code

Another vector signaling code herein called "5b6w" is designed to send on a group of six wires 2 "+" signals, 2 "−" signals, and 2 "0" signals. This code is thus "balanced", having the same number of "+" values as "−" values per group, allowing each code to sum to a constant value of zero. A knowledgeable practitioner may note that without additional constraint, a code based on sending 2 "+" signals and 2 "−" signals on every group of 6 wires has 90 distinct combinations, sufficient to encode 6 bits instead of 5. However, as fully described in [Fox III], a subset of 32 code words is used to encode 5 binary bits, with a significantly simplified receiver.

The examples in [Fox III] combine the 5b6w code with an output driver structure optimized to generate three distinct output voltages on a high-impedance CMOS-compatible interconnection with very low power consumption. Examples herein illustrate the combination of 5b6w code and ternary signal levels with output drivers optimized for use with matched impedance terminated transmission lines.

Multiphase Processing

Figure 3:
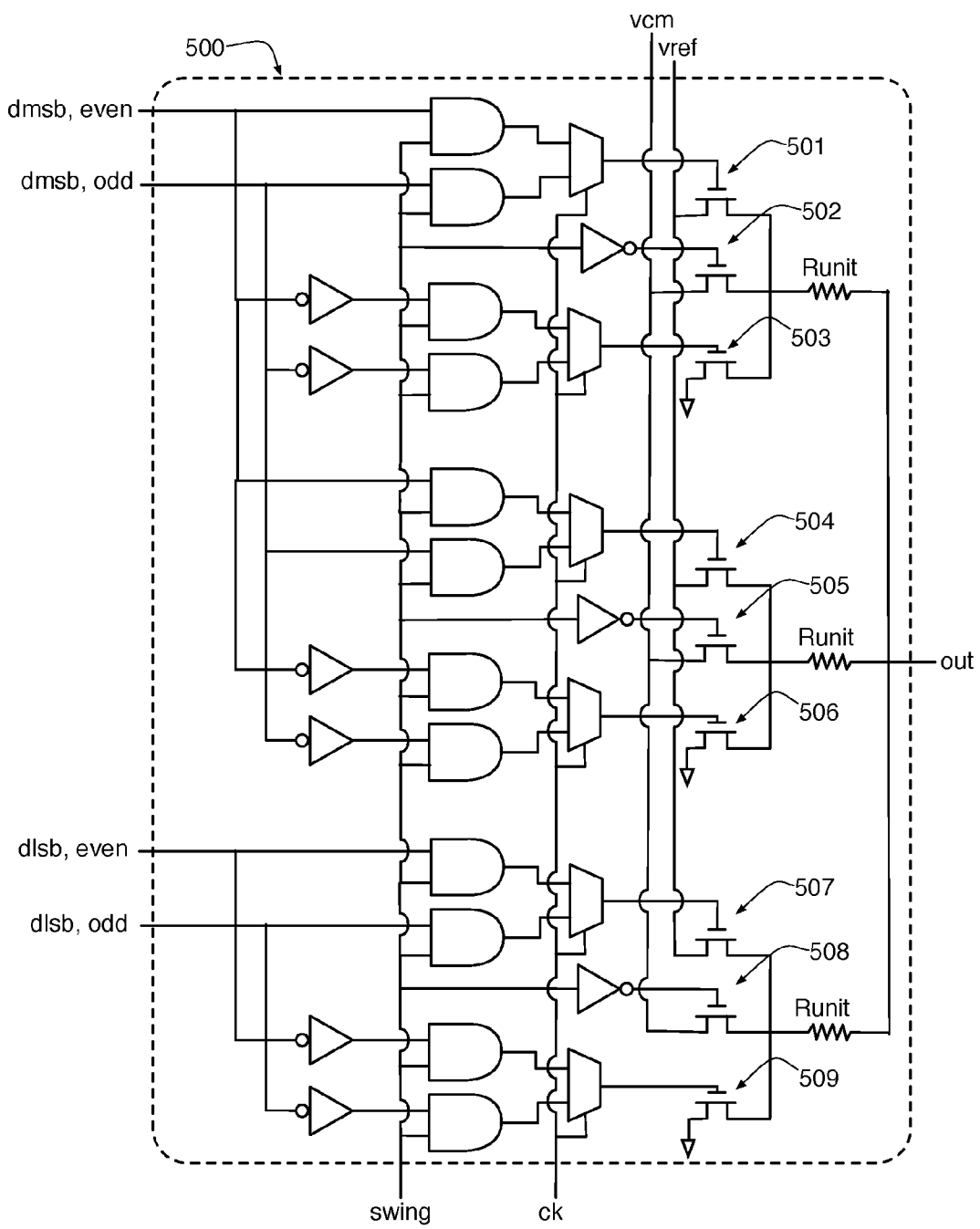
FIG. 3 is a schematic of an output line driver subsystem incorporating two processing phases, and suitable for use in a multi-slice embodiment.
Figure 4:
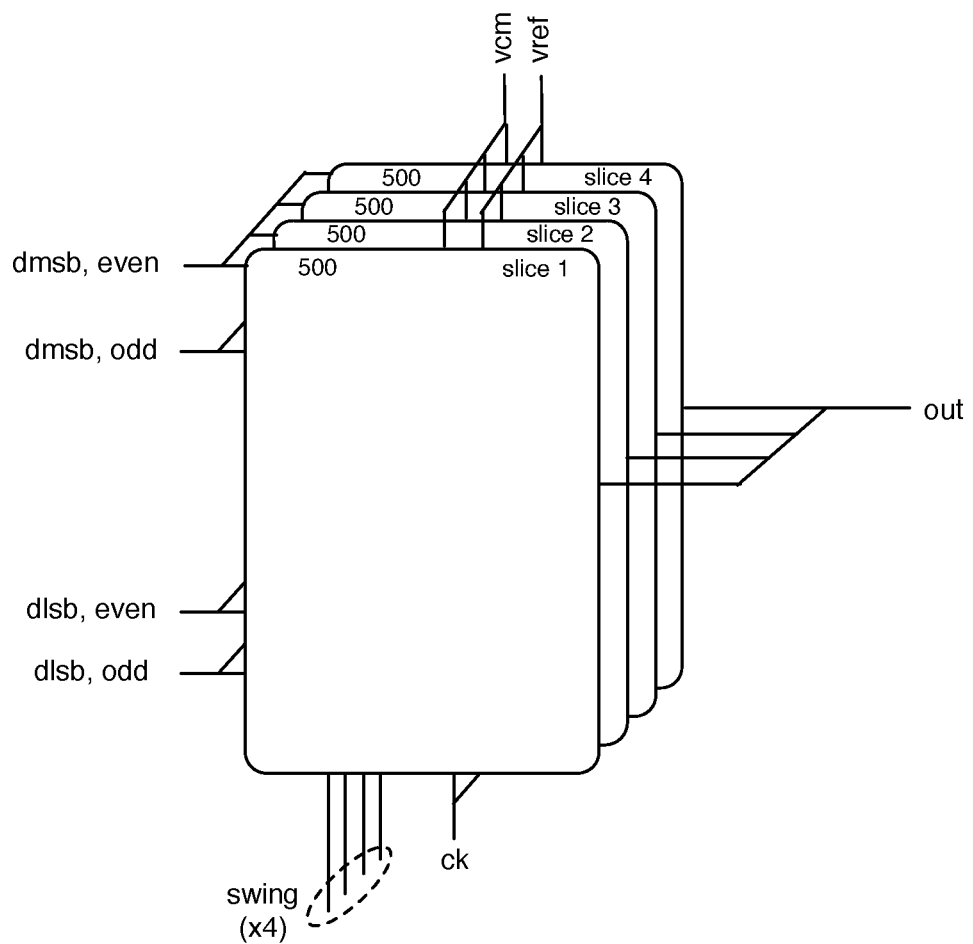
FIG. 4 is an embodiment of a multi-slice single wire driver utilizing multiple instances of the subsystem of FIG. 3.
Figure 5:
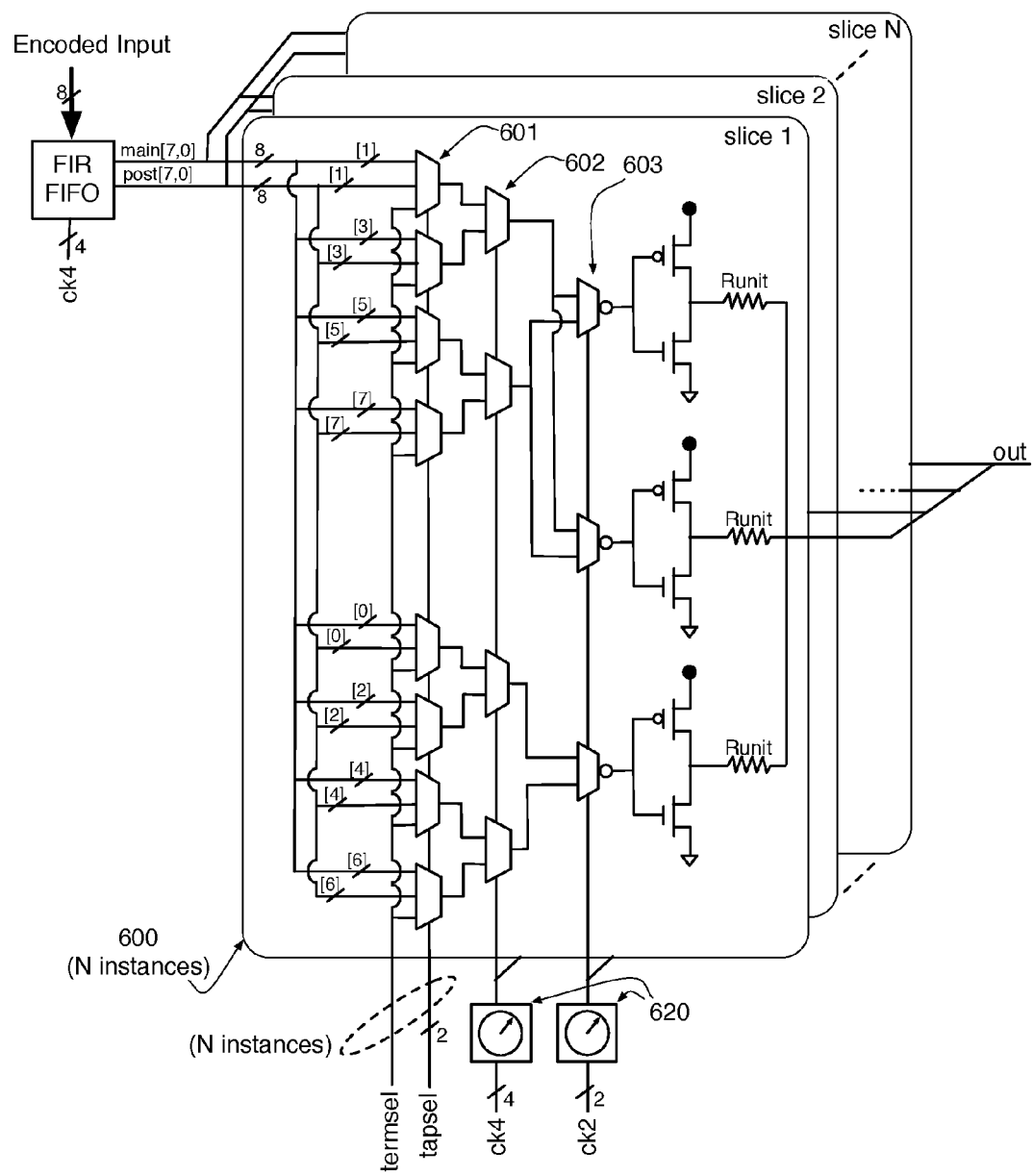
FIG. 5 is a block diagram of one embodiment of a multi-slice single wire driver incorporating four phases of processing and transmit pre-compensation.
Figure 6:
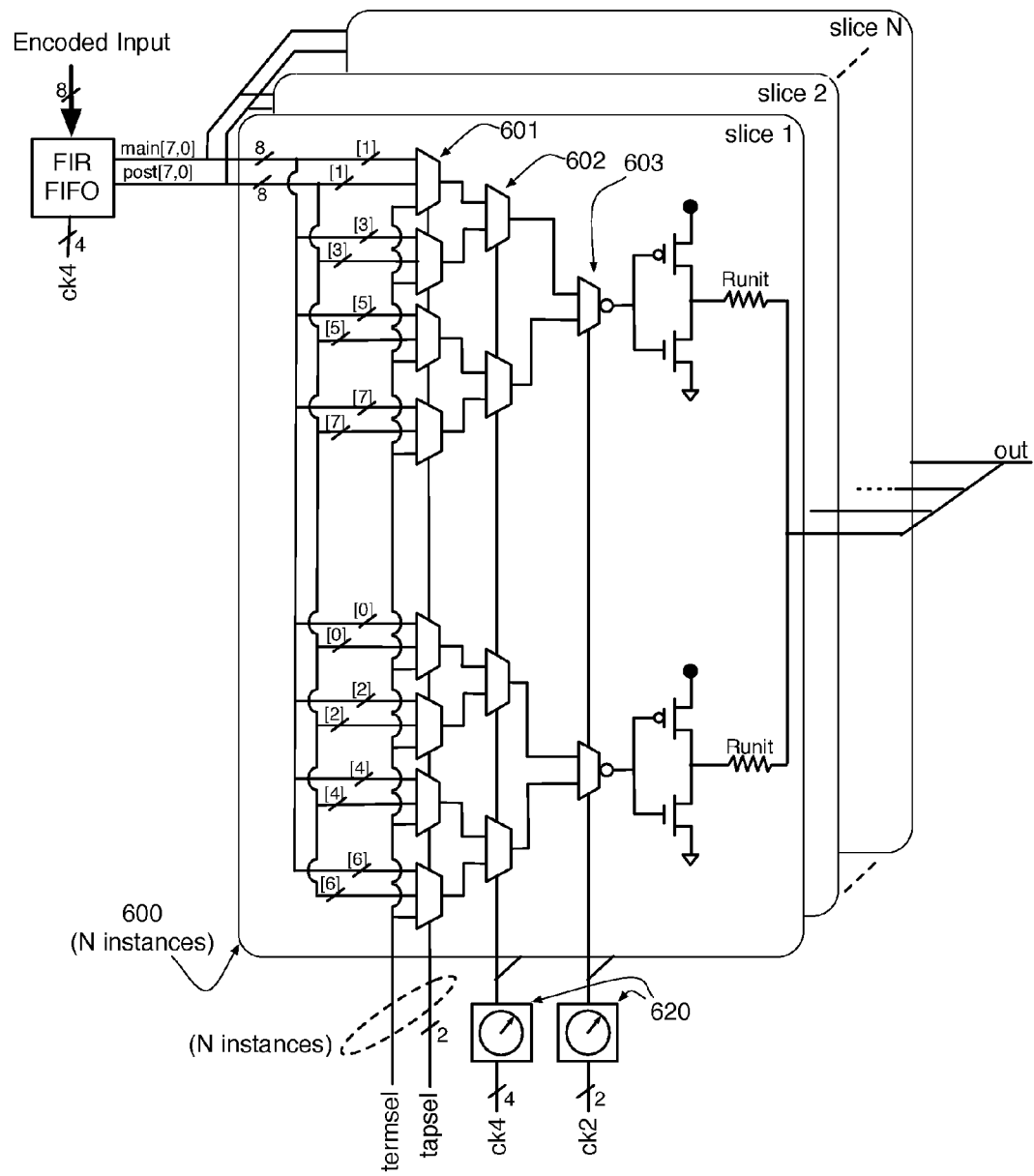
FIG. 6 is a block diagram of another embodiment of a multi-slice single wire driver incorporating four phases of processing and transmit pre-compensation.

High-speed communications embodiments often exceed the performance capabilities of a single communications circuit instance, thus rely on parallel processing or pipelined processing techniques to provide higher throughput. As examples presented without implying a limitation, FIG. 1, FIG. 5, and FIG. 6 illustrate embodiments providing four processing phases each operating at one quarter the wire unit interval transmission rate which are interleaved to produce the final wire rate transmission sequence, and FIG. 3 and FIG. 4 show embodiments having two processing phases operating at one half the wire interval transmission rate which are interleaved to produce the final wire rate output sequence. Any number of phases may be used in a particular embodiment, from a single phase performing all operations, to sixteen or more parallel processing phases, with each of such multiple phases possibly also extending over a greater or lesser portion of the described transmission system than shown by these examples.

Example H4 Driver

FIG. 1 is a block diagram representative of at least one embodiment of the invention. As previously mentioned, this example incorporates four phases of encoder logic 110 each operating at one quarter of the transmit clock rate, the outputs of which are subsequently interleaved to produce the final transmitted data stream. For purposes of description, a transmit output stream unit interval of 62.5 picoseconds, corresponding to a transmission rate of 16 Gigasymbols/ second is assumed. Thus, each phase of the Quarter-rate clock operates at 4 GHz, and each encoder has 250 ps of processing time per cycle.

As the H4 code encodes three binary bits in each four symbol codeword, the Data Input consists of three bits of data for each of four parallel processing phases. Thus, a total of 12 input bits are processed for each four transmit intervals. Encoder 110 contains four distinct instances of encoding logic, each mapping three binary data input bits into four symbol values. As each of the four symbols can take on one of four coordinate values (thus requiring two binary output bits per symbol), each encoder output 112, 114, 116, 118 is eight bits.

Transmit pre-drivers 120, 220, 320, and 420 each have a digital driver input that accepts encoder output values corresponding to one symbol of the codeword, and prepares it to be output on one wire, w0, w1, w2, and w3 respectively. As an example, the two least significant bits of encoder output (that is, the coordinate value for the least significant symbol of the code word vector) are received and processed by 120, which maps the selected symbol value into a result selecting a particular wire signal value representing that signal value. Multiplexer 130 then interleaves the four phases of results into a single output stream which multilevel output line driver 140 transmits on wire w0. The timing of the output signal may be adjusted using phase compensator 150, introducing an adjustable phase delay between the quarter rate clock signals and the output driver. This adjustable delay may provide pre-compensation for propagation time differences on individual wires, as part of an overall skew compensation solution. In one exemplary embodiment, the range of adjustment spans approximately one quarter-rate clock interval, less any required set up, hold, and/or fall through time for data latches in the encoder signal path between encoder and output. Using the specific example of a 62.5 picosecond transmit unit interval, an adjustment range of 90 degrees of the quarter-rate clock corresponds to a skew pre-compensation of up to 62.5 ps, which is equivalent to approximately 12 mm of differential path length for transmission lines on common backplane materials.

Multilevel Output Line Driver

Figure 2A:
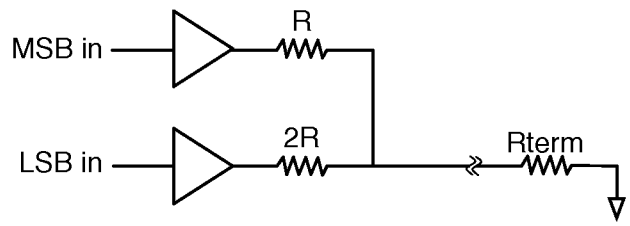
FIGS. 2A through 2D are schematics showing respective embodiments of a multi-level output line driver.

Operation of the multilevel output line driver (as in FIG. 1's 140, 240, 340, 440) is illustrated in FIGS. 2A through 2D. The line driver uses a conventional CMOS complimentary pair, stacked pair, or source follower output driver for each significant bit of output resolution, and resistive analog summing of the significant bit outputs to the final output result. Thus, as shown in FIG. 2A, one embodiment of a four level (two bits of coordinate selection) driver uses two output stages, each driving the common load of the transmission line impedance Rterm through a different source impedance to obtain distinct output levels. The MSB driver source impedance R is one half that of the LSB driver source impedance 2R, thus will have twice the effect on the output voltage. In a practical embodiment, the parallel combination of R and 2R matches transmission line impedance Rterm to provide correct source termination resistance. Thus, if the transmission line impedance is 50 ohms, matched source impedance is achieved in FIG. 2A when R is 75 ohms and 2 R is 150 ohms.

Figure 2B:
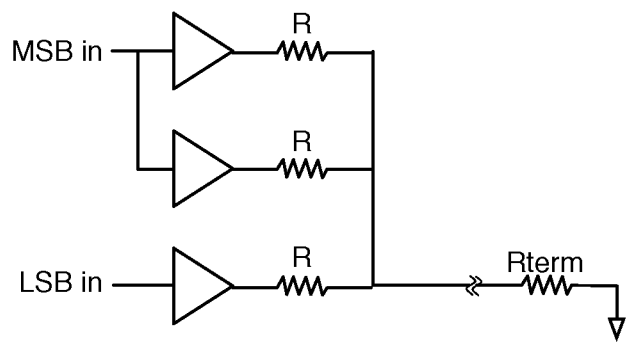

As is well known to one familiar with the art, it is relatively simple to ratiometrically match resistor values on-chip. However, if the impedances R and 2R are to be selected, trimmed, or adjusted to accurately incorporate the internal impedance of the driver transistors as well, it becomes significantly more difficult to design such R/2R structures. The alternative embodiment of FIG. 2B uses duplicated driver elements to significantly simplify matching, while maintaining the binary weighting among the various data bits of the previous embodiment. In FIG. 2B, all impedance R values are identical, with the parallel combination of the three R impedances in FIG. 2B matching Rterm. Thus, for the example 50 ohm impedance, each R would be 150 ohms (including the effective impedance of its drive transistors.) Reliance on multiple identical-value resistors and multiple identical-characteristic transistors is well recognized as an advantageous practice in integrated circuit design. For example, [Kojima] describes a multi-level output driver circuit incorporating multiple paralleled output drivers and same-value resistors where each control input manipulates a binary weighted number of drivers and resistors to drive an output to multiple desired voltage levels, in a manner comparable to that shown in the present application's FIG. 2B. [Kojima] also describes use of a R/2R resistive ladder network to obtain comparable multi-level output levels, such ladder structures being well known in the art.

Figure 2C:
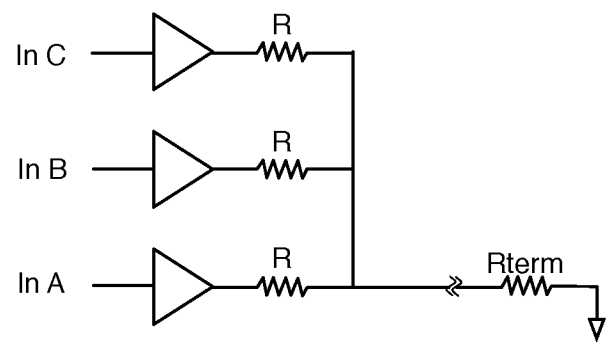

An alternative embodiment, shown as FIG. 2C, utilizes unary rather than binary weighting. Where the previous embodiments obtain an output level of "2" by enabling MSB in and disabling LSB in, an additive unary driver such as that of FIG. 3 requires any two of inputs In A, In B, or In C to be enabled. Thus, if FIG. 2A may be described as utilizing binary additive analog summing of the MSB and LSB values, FIG. 2B may be described as utilizing unary additive analog summation of a first and a second data values.

Figure 2D:
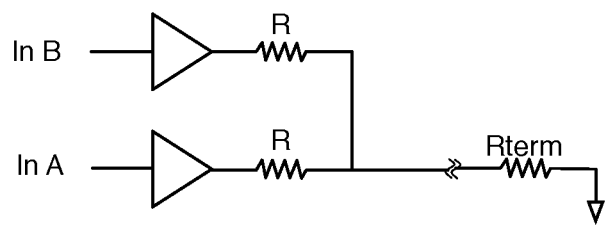

One familiar with the art will observe that these examples may also be directly utilized for three level (ternary) signaling such in the 5b6w code or indeed for two-level (binary) signaling, and may readily be extended by addition of additional resistors and driver elements to higher-order signaling as well. Similarly, simplifying the circuit of FIG. 2C to create the circuit of FIG. 2D is sufficient for embodiments using no more than ternary signaling.

FIG. 3 shows a schematic diagram of an output driver subsystem incorporating the technique of FIG. 2B and using two phase (i.e. half transmit output clock rate) input processing. The two phases of input data provided to the digital driver input of the driver slice 500 are "even" and "odd", with multiplexers controlled by clock ck interleaving the even and odd signals into the combined output stream. The MSB portion of the input data controls two paralleled output transistors 501/502/503 and 504/505/506, while the LSB portion controls single output transistors 507/508/509. The Boolean logic decodes the state of the data bit, with an input "1" enabling transistors 501 and 504 for the MSB, or 507 for the LSB, connecting the Runit resistors to positive voltage Vref, resulting in a positive output offset. An input "0" enables transistors 503 and 506 for the MSB, or 509 for the LSB, connecting the Runit resistors to Vdd, resulting in a negative output offset. As with the example of FIG. 2B, the voltage switching circuitry (501/502/503 or 504/505/506) for the MSB driving two Runit resistors results in twice the effect on the output wire, relative to the voltage switching circuitry (507/508/509) for the LSB driving one Runit resistor.

Control signal "swing" may be deasserted to disable both "1" and "0" outputs, allowing transistors 502, 505, and 508 to drive resistors Rterm to the constant voltage node vcm, the common mode or idle voltage value.

Multiple Output Driver Slices

One familiar with the art may observe that implementing on-chip resistors of the low values appropriate to the circuits of FIGS. 2A through 2D and FIG. 3 is problematic, as a typical sheet resistance available in a semiconductor process is 800-900 ohms/square. Thus, a resistor of even 150 ohm value would require an unacceptable length: width ratio of 2:11. Moreover, the correspondingly low on-resistance (i.e. on the order of tens of ohms) required in the output transistors would make them unacceptably large.

Similarly, the teachings of [Kojima] do not address the issues of drive transistor impedance (i.e. physical device size on the integrated circuit die) or achieving both accurate and implementable low value resistors in an integrated circuit embodiment.

FIG. 4 illustrates multiple instances of FIG. 3's output driver subsystem controlling a single output wire. Each of the four instances of 500, respectively labeled slice 1-4, are in parallel except for control inputs "swing". Thus, if "swing" is enabled only to slice 1, only its drivers will contribute to generating offset voltages for coordinate data, with slices 2, 3, and 4 providing only resistive connections from "out" to vcm.

Enabling additional slices in parallel scales the resulting output offsets linearly if all values of Runit are identical on all slices, as the output value seen at common output node "out" is controlled by the arithmetic sum of each incremental offset produced by each slice. This unary slicewise addition permits the output swing to be adjusted to four distinct values with four slices. This parallel slice approach also permits a significant increase of the ratio of Runit to Rterm. With the example four slices, the required resistance of each individual output resistor or other resistive element for all slices operating in parallel driving the example 50 ohm line impedance increases to 600 ohms. With forty such slices, the required resistor value increases to 6000 ohms, which may be obtained, as one example, by combining an easily-implemented 5400 ohm on-chip resistor with reasonable 600 ohm drive transistor impedance. The identical and repetitive design of the multiple slices allows for simple layout and consistent results. Thus, this approach allows significant benefits to integrated circuit implementation.

One might observe that scaling the resistive values of resistive elements (i.e. Runit values) on different slices would allow broader adjustment range; as one example, binary scaling (e.g. making the resistance element values on slice 2 one half those on slice 1, etc.) would allow four slices to provide 16 distinct scaled output swings. However, as with the example of FIG. 2A, such as scheme will have issues maintaining accurate ratiometric matching, potentially resulting in non-monotonic adjustment results for the resulting assembly. Such a weighted solution also does not address the implementation issues associated with low-value resistances and transistor impedances in the more-significant (i.e. lower R ratio) output slices. Thus, a preferred embodiment of a low impedance transmission line driver utilizes larger numbers of identical slices that are combined via unary addition.

Multi-slice Output Driver with Transmit Equalization

Expanding upon the previous examples, FIG. 5 shows a set of N output driver slices operating concurrently to drive an output wire. Each output driver slice 600 is comprised of a high-speed 4:1 digital mux for each of the MSB and LSB output control bits, combining the four encoded data phases into a full rate output stream driving three identical line drivers, two for the MSB and one for the LSB, producing a single output. In this example, the high-speed 4:1 mux is implemented as two stages of 2:1 multiplexing, with elements 602 being a representative element of the first stage, and 603 being a representative element of the second stage. Similarly, for purposes of illustration this example shows a CMOS line driver used to drive each Runit resistive element.

In FIG. 5, the high-speed 4:1 mux is preceded by an input selection mux or pre-driver switching circuit (of which 601 is an example element,) allowing selection of a driver input source from the main[ ] or post[ ] input busses, or from the termsel inputs. Thus, appropriate configuration of the tapsel control signal inputs to any given slice allows that slice to be dedicated to a main stream of symbol values labeled main[ ], a delayed stream of symbol values labeled post[ ], or emission of a fixed output value as represented by the termsel input. The termsel inputs thus provide a quiescent input that, when selected, produce a fixed output value, such as a fixed output voltage.

In one example embodiment, such slice assignment is determined as part of a configuration or initialization procedure, thus the tapsel input selection mux control signals and/or termsel input will typically change only occasionally or infrequently, compared to the output data rate. Depending on layout constraints and system design preferences, the illustrated signal inputs termsel and tapsel controlling a data slice from a centralized configuration system may be replaced by distributed control registers or distributed control processors or state machines performing a comparable function for each slice or subset of slices Assignment of different numbers of slices to the same input allows control of that input's relative output levels. As an example, if forty slices are configured for input from main[ ] to provide a main series of signal levels, the total output swing at the wire output "out" will be Vdd*Rterm/((Runit/40*3)+Rterm) and may be reduced by increments of 2.5% (1/40th of that total) by configuring a portion of those slices to output a fixed output value (as one example, Vss) rather than data. The quiescent voltage level of the output may be adjusted by selection of different fixed output values for some or all of the non-data slices.

Thus, appropriate assignment of a first number of slices to a data input permits control of the output signal amplitude, while assignment of a second number of slices to a fixed signal input permits control of the output signal bias or offset level. As the aggregate driver output impedance is a function of the number of Runit values in parallel across all output drivers and slices, the source impedance facing the communications channel may also be adjusted based on the number of slices actively driving that output. Other slices may be placed in a tri-state or high impedance mode with the use of disabling circuitry. Disabling circuitry may include, for example, a switch that disconnects a slice output from the common output node, or it may include within the voltage switching circuitry a transistor operative to connect the slice output to a high impedance node instead of to a constant-voltage source. Disabling selected slices serves to increase the output impedance of the signal generator and can be used to match the impedance of transmission lines.

Finite Impulse Response Equalization

Frequency equalization, waveform control, and other pre-compensation for communications channel anomalies such as reflections and inter-symbol interference (ISI) may be implemented in a transmission line driver using Finite Impulse Response (FIR) filtering techniques.

A FIR filter represents the desired frequency-based or waveform-based signal in the time domain, specifically as a weighted sum of N signal values over time. For a transmitter, the N signal values identify N chronologically consecutive signal values, such as the value being output during the present transmission unit interval (UI) and N−1 values representing outputs in chronologically preceding or following transmission unit intervals. As an example, one FIR embodiment may combine weighted values representing two preceding, the current, and three following unit intervals.

The multiple slice architecture of the present invention lends itself to a simple and efficient FIR embodiment. As previously described, the number of slices assigned to output a main series of signal levels controls the amplitude of the resulting output signal, corresponding to a scaling or multiplicative weighting of the signal output. Similarly, assignment of different slices or groups of slices to different functions, such as a delayed series of signal levels or an advanced series of signal levels, produces an equalized output signal corresponding to the sum of the slice outputs, components of that sum being weighted by the number of slices in each group.

A signal generator may comprise an equalization circuit that processes the input to the driver slices. One such equalization circuit is the FIR FIFO (first-in-first-out) circuit of FIG. 5, which includes a clocked delay line allowing access to data chronologically preceding or following the current transmit data for purposes of transmit equalization, such as provided by a Finite Impulse Response filter. Depending on the desired delay amount and process capabilities, circuitry such as cascaded latches, digital shift register, FIFO register file, or a FIFO circular loop buffer may be used as the digital delay element.

The FIR FIFO may also incorporate data alignment functions supporting a multi-phase processing architecture, for example allowing an input stream of data aligned to one clock phase to be properly timed for use in outputting a different clock phase's data. Such data alignment functions are well known to those familiar with the art, and allow a wide input data word as represented by the input stream labeled "Encoded Input" in FIG. 5 to be accepted based on, as one example, quarter rate clock phase 0, while outputting four narrower data words individually timed to the phase 0, phase 1, phase 2 and phase 3 output intervals represented by the various combinations of clk4( ) and clk2 ( ) signals to each driver output mux, with tap delays available in increments of one unit interval. To facilitate understanding, the FIR FIFO function may also be interpreted as an equivalent "black box" comprised of a simple single-phase narrow FIFO operating at the full UI clock rate, with individual output taps that are then retimed using latches to be synchronous to the appropriate output clock phase required.

As one example and without limitation, FIG. 5 shows the FIR FIFO accepting an Encoded Input stream of 8 bits, corresponding to two bits of coordinate selection information from each of four encoder processing phases, and deriving a main tap output of transmit data (2 bits per symbol for each of four phases) labeled as main[7,0] and one delayed tap output representing chronologically-offset transmit data labeled as post[7,0]. If, continuing the example, six slices are assigned to post[ ] and forty slices are assigned to main[ ], the chronologically-offset signal represents 15% of the main output signal, a typical amount of pre- or post-emphasis for transmit equalization or ISI elimination. One familiar with the art will note that both the overall signal amplitude and the weighted equalization amount may be adjusted by selection of different numbers of slices assigned to generate the main series of signal levels versus the delayed series of signal levels and/or the advanced series of signal levels.

The necessary adjustment information may be obtained by external testing of the signal paths, or through feedback of receiver information to the transmitter via a return channel.

As one familiar with the art will recognize, the weighting factors used in a FIR embodiment generally consist of one positive term (for the on-time or current unit interval component) and multiple negative terms corresponding to earlier or later unit interval components. One embodiment hardwires tap polarities based on these anticipated FIR parameters, as one example providing main tap outputs that are non-inverted and advanced taps and/or delayed tap outputs that are inverted. Another embodiment provides the ability to select either inverted or non-inverted FIR FIFO tap data by, as one example, introduction of digital inverting circuitry such as an XOR element into some or all FIR FIFO tap output paths.

One further embodiment extends the architecture of FIG. 5 by incorporating additional FIR FIFO taps, additional input multiplexer selection options, and larger numbers of slices to support more complex FIR transmit equalization with adjustable output amplitude and offset voltage. Another such embodiment allocates up to seven slices to advanced stream of symbol values provided by advanced taps, up to forty slices to the main stream of symbol values provided by the main tap, and fifteen slices to a delayed stream of symbol values provided by delayed taps, for each wire output. Additional slices (and any slices not in active use) may be configured as quiescent driver slices to provide a quiescent or baseline output voltage, or may optionally be set to an inactive or high impedance state, incrementally increasing the effective transmit impedance should that be required to better match the transmission line characteristics. Alternate embodiments utilizing output driver structures as shown in FIG. 3 may similarly select termination to constant-voltage nodes such as vcm, termination to gnd, termination to vref, or other nodes such as a high impedance node, or active data output as configurable slice behaviors.

The embodiment illustrated in FIG. 5 shows each slice having input multiplexers 601 allowing any slice to output main, delayed, or termination levels. Other embodiments may incorporate wider input multiplexers, allowing slices to select, as one example, data from additional FIR FIFO taps. Alternative embodiments may simplify the input multiplexers on some or all slices, to dedicate those slices to particular or more limited ranges of functions or sets of taps. This simplification may reduce power consumption and/or circuit loading, by eliminating circuit elements not actively utilized in a particular application.

Depending on the number of output levels required to represent the encoded signals, fewer or more output multiplexers, driver transistors, and series resistors may be required per slice, and fewer or more Encoded Input bits may be provided to each driver to select such levels. For purposes of illustration, FIG. 5 shows these elements structured as described in FIG. 2B. Other embodiments such as shown in FIG. 6 may structure these same elements as described in FIG. 2C or FIG. 2D.

Skew Compensation

As described in association with FIG. 1, embodiments as in FIG. 5 and FIG. 6 may incorporate digital phase delays or interpolators 620 in the clk4 and clk2 lines controlling the timing of the full wire rate output. Phase adjustment of clocks to slices serving a particular wire allows transmit-side pre-compensation for signal propagation skew, by incrementally advancing or delaying that wire's signals relative to other wire signals. Such transmit-side adjustment facilitates use of receive detectors as taught in Ulrich I. These figures show interpolators 620 adjusting the clock signals provided to all slices driving an output wire, as a straightforward illustration of adjustment for signal propagation skew. Other embodiments may incorporate such clock phase or interpolation adjustment near or within each slice or subset of slices, either to allow compensation for clock propagation delays within the chip itself, or to permit incremental adjustment of timing between individual slices driving the same output.

The necessary adjustment information may be obtained by external testing of the signal paths, or through feedback of receiver information to the transmitter. Another example of transmitter compensation for receiver skew is shown in Holden I.

Given sufficient delay capabilities within the FIR FIFOs and sufficient slice input multiplexer flexibility, encoded signals going to particular wire outputs may not only be offset by a portion of a unit interval relative to other wire outputs, but may also be offset by more than one unit interval relative to other wire outputs, by utilizing main outputs representing different FIFO delay amounts than that provided to other wire outputs. As an example, a FIR FIFO storing a total of eight taps (i.e. eight wire rate transmission intervals) of history may be configured to output a one UI advanced pre-output, a main output, and one UI delayed and two UI delayed post-outputs, with the pre- and post-outputs used for FIR filtering of the output waveform. If these FIFO outputs are taken, as examples, from the second, third, fourth, and fifth taps respectively, and an equivalent FIFO servicing a different wire output utilizes the fourth, fifth, sixth, and seventh taps, the first wire output will be advanced (pre-skew compensated) by two UI intervals, relative to the second wire output. This two UI offset may then be incrementally adjusted by an additional fraction of a UI, by setting the phase interpolators on the clk signals to the first wire's slices to a different value than the phase interpolators on the clk signals to the second wire's slices.

The examples presented herein illustrate the use of vector signaling codes carried by matched impedance parallel transmission line interconnections for chip-to-chip communication. However, those exemplary details should not been seen as limiting the scope of the described invention. The methods disclosed in this application are equally applicable to other interconnection topologies and other communication media including optical, capacitive, inductive, and wireless communications which may rely on any of the characteristics of the described invention, including but not limited to communications protocol, signaling methods, and physical interface characteristics. Thus, descriptive terms such as "voltage" or "signal level" should be considered to include equivalents in other measurement systems, such as "current", "optical intensity", "RF modulation", etc. As used herein, the term "signal" includes any suitable behavior and/or attribute of a physical phenomenon capable of conveying information. The information conveyed by such signals may be tangible and non-transitory.

I claim:

1. An apparatus comprising:
a plurality of driver slices arranged in parallel, each driver slice having a digital driver input and a slice output, each driver slice configured to generate a signal at a signal level determined by the digital driver input, and wherein each driver slice comprises:
a plurality of resistive elements having a first and a second end, the first end of each of the resistive elements being connected to the driver slice output; and,
for each resistive element, a voltage switching circuit connected to the second end of the resistive element, the voltage switching circuit configured to selectively couple the second end of the resistive element to a respective constant-voltage node in a group of at least two constant-voltage nodes, the voltage switching circuit being controlled by the digital driver input; and,
a common output node connected to (i) the plurality of driver slice outputs, (ii) a wire of a multi-wire bus.

2. The apparatus of claim 1, further comprising a disabling circuit configured to adjust an output impedance at the common output node by selectively enabling and disabling driver slices in the plurality of driver slices.

3. The apparatus of claim 1, wherein each driver slice further comprising a pre-driver switching circuit configured to couple the respective digital driver input to one of a group of driver input sources.

4. The apparatus of claim 3, wherein the group of driver input sources comprises a quiescent input.

5. The apparatus of claim 1, wherein each driver slice is configured to provide one of at least three possible signal level values to the common output node.

6. The apparatus of claim 1, wherein each resistive element in the plurality of resistive elements has the same impedance value.

7. The apparatus of claim 1, wherein at least two resistive elements for two different driver slices have different impedance values.

8. The apparatus of claim 1, wherein the plurality of driver slices comprises at least forty driver slices.

9. The apparatus of claim 1, wherein an output impedance at the common output node is equal to 6,000 ohms.

10. The apparatus of claim 1, wherein the wire of the multi-wire bus is configured to provide a symbol of a codeword of a vector signaling code, the symbol generated by a summation of the signals generated by the plurality of driver slices.

11. A method comprising:
obtaining an input stream of symbol values;
providing the input stream of symbol values to a plurality of driver slices, each driver slice having a respective resistive element;
generating a plurality of series of signal levels determined by the input stream of symbol values, each respective series of signal level values generated using a respective driver slice, wherein generating the respective series of signal levels comprises selectively coupling the respective resistive element to a constant-voltage node of a respective group of constant-voltage nodes, the constant-voltage node selected based on the input stream of symbol values; and
forming an output symbol value based on a summation of the plurality of series of signal levels at a common output node.

12. The method of claim 11, further comprising adjusting an output impedance at the common output node by selectively enabling and disabling driver slices in the plurality of driver slices.

13. The method of claim 11, wherein for each driver slice, the input stream of symbol values is obtained from a respective pre-driver switching circuit, the input stream of symbol values selected from a group of driver input sources.

14. The method of claim 13, wherein the group of driver input sources comprises a quiescent input.

15. The method of claim 11, wherein each signal level in a given series of signal levels has a signal level value from a set of at least three possible signal level values.

16. The method of claim 11, wherein the resistive element in each driver slice has the same impedance value.

17. The method of claim 11, wherein at least two resistive elements for two different driver slices have different impedance values.

18. The method of claim 11, wherein the plurality of driver slices comprises at least forty driver slices.

19. The method of claim 11, wherein an output impedance at the common output node is equal to 6,000 ohms.

20. The method of claim 11, wherein the output symbol is a symbol of a codeword of a vector signaling code.

* * * * *